(12) United States Patent
Kulla et al.

(10) Patent No.: US 11,294,000 B1
(45) Date of Patent: Apr. 5, 2022

(54) MAGNETIC FIELD SENSOR WITH AN ADJUSTABLE THRESHOLD FOR STRAY FIELD IMMUNITY

(71) Applicant: Allegro MicroSystems, LLC, Manchester, NH (US)

(72) Inventors: Florian Kulla, Annecy (FR); Andrea Foletto, Andorno Micca (IT)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/060,276

(22) Filed: Oct. 1, 2020

(51) Int. Cl.
*G01R 33/025* (2006.01)
*G01R 33/07* (2006.01)
*G01R 33/09* (2006.01)

(52) U.S. Cl.
CPC ......... *G01R 33/025* (2013.01); *G01R 33/077* (2013.01); *G01R 33/09* (2013.01)

(58) Field of Classification Search
CPC ..... G01R 33/025; G01R 33/077; G01R 33/09
USPC ........................................................ 324/244
See application file for complete search history.

(56) References Cited

U.S. PATENT DOCUMENTS

| | | |
|---|---|---|
| 3,697,870 A | 10/1972 | Brenner |
| 4,405,896 A | 9/1983 | Akita |
| 5,339,067 A | 8/1994 | Harris et al. |
| 5,442,283 A | 8/1995 | Vig et al. |
| 5,497,084 A | 3/1996 | Bicking |
| 5,554,948 A | 9/1996 | Hansen et al. |
| 5,650,719 A | 7/1997 | Moody et al. |
| 5,670,886 A | 9/1997 | Wolff et al. |

(Continued)

FOREIGN PATENT DOCUMENTS

| | | |
|---|---|---|
| CN | 102 388 316 | 3/2012 |
| EP | 2 391 903 22 | 12/2012 |

(Continued)

OTHER PUBLICATIONS

Response to Final Office Action filed on Mar. 17, 2017 for U.S. Appl. No. 14/600,826; 14 pages.

(Continued)

*Primary Examiner* — Christopher P McAndrew
(74) *Attorney, Agent, or Firm* — Daly, Crowley, Mofford & Durkee, LLP

(57) ABSTRACT

A magnetic field sensor for detecting motion of an object includes one or more magnetic field sensing elements configured to generate a magnetic field signal in response to a magnetic field associated with the object and a detector configured to generate a comparison signal having edges occurring in response to a comparison of the magnetic field signal and a threshold signal and occurring at a rate corresponding to a speed of motion of the object. A speed monitor responsive to the comparison signal is configured to generate a speed signal having a value indicative of the speed of motion of the object. A threshold generator having an input coupled to receive the speed signal from the speed monitor and an output coupled to the detector is configured to generate the threshold signal at a first level when the value of the speed signal indicates that the speed of motion of the object is greater than a predetermined speed and at a second level when the value of the speed signal indicates that the speed of motion of the object is less than the predetermined speed.

22 Claims, 3 Drawing Sheets

(56) References Cited

U.S. PATENT DOCUMENTS

| | | | |
|---|---|---|---|
| 5,729,130 | A | 3/1998 | Moody et al. |
| 5,917,320 | A | 6/1999 | Scheller et al. |
| 6,091,239 | A | 7/2000 | Vig et al. |
| 6,100,680 | A | 8/2000 | Vig et al. |
| 6,242,908 | B1 | 6/2001 | Scheller et al. |
| 6,289,072 | B1 | 9/2001 | Hubbard et al. |
| 6,356,741 | B1 | 3/2002 | Bilotti et al. |
| 6,404,188 | B1 | 6/2002 | Ricks |
| 6,525,531 | B2 | 2/2003 | Forrest et al. |
| 6,693,419 | B2 | 2/2004 | Stauth et al. |
| 6,853,178 | B2 | 2/2005 | Hayat-Dawoodi |
| 6,919,720 | B2 | 7/2005 | Vig et al. |
| 7,199,579 | B2 | 4/2007 | Scheller et al. |
| 7,362,094 | B2 | 4/2008 | Voisine et al. |
| 8,058,864 | B2 | 11/2011 | Scheller et al. |
| 8,089,270 | B2 | 1/2012 | Scheller et al. |
| 9,970,996 | B2 | 5/2018 | Fernandez et al. |
| 10,690,731 | B2 | 6/2020 | Foletto et al. |
| 2003/0231013 | A1 | 12/2003 | Faymon et al. |
| 2006/0119348 | A1* | 6/2006 | Blossfeld ............ F02D 41/0097 324/166 |
| 2009/0001972 | A1 | 1/2009 | Fernandez et al. |
| 2012/0249126 | A1 | 10/2012 | Friedrich et al. |
| 2013/0271124 | A1* | 10/2013 | Kirkpatrick ........ G01R 33/0035 324/251 |
| 2015/0268312 | A1* | 9/2015 | Rivas .................... G01R 33/09 324/251 |

FOREIGN PATENT DOCUMENTS

| | | | |
|---|---|---|---|
| JP | 2005 517 187 | 6/2005 | |
| JP | 2007 132 706 | 5/2007 | |
| JP | 2012 520 460 | 9/2012 | |
| WO | WO 03/067269 A2 | 8/2003 | |
| WO | WO-03067269 A2 * | 8/2003 | ............. H03K 5/082 |

OTHER PUBLICATIONS

Response to Final Office Action filed on Feb. 26, 2018 for U.S. Appl. No. 14/600,826; 11 pages.
Datasheet, Allegro Microsystems, Inc., "ATS637LSA, True Power On, Self-Calibrating, Zero Speed Gear Tooth Sensor System," Aug. 2001, 13 pages.
Datasheet, Allegro Microsystems, Inc., "ATS633LSB True Power On, Self-Calibrating, Zero Speed Gear Tooth Sensor System," 2001, 2003, 15 pages.
National Semiconductor, ADC0852/ADC0854 Multiplexed Comparator with 8-bit Reference Divider; Apr. 1995; 20 Pages.
Preliminary Amendment filed on Apr. 12, 2010 for U.S. Appl. No. 12/401,096; 7 pages.
Notice of Allowance dated Oct. 6, 2011 for U.S. Appl. No. 12/401,096; 9 pages.
Search Report and Written Opinion dated Mar. 26, 2010 for PCT Application No. PCT/US2010/020602, 13 pages.
International Preliminary Report on Patentability dated Sep. 22, 2011 for PCT Application No. PCT/US2010/020602, 8 pages.
Chinese Office Action with English translation dated Jun. 28, 2013 for Chinese Application No. 201080011537.8; 17 pages.
Instruction Letter for responding to Chinese Office Action dated Jun. 28, 2013 for Chinese Application No. 201080011537.8; 7 pages.
Response to Chinese Office Action dated Nov. 8, 2013 for Chinese Application No. 201080011537.8; 10 pages.
Chinese Office Action with English translation dated Jan. 28, 2014 for Chinese Application No. 201080011537.8; 6 pages.
Comments to Office Action dated Jan. 28, 2014 for Chinese Application No. 201080011537.8; 1 page.
Instruction Letter for responding to Chinese Office Action dated Jan. 28, 2014 for Chinese Application No. 201080011537.8; 1 page.
Response to Chinese Office Action dated Feb. 13, 2014 for Chinese Application No. 201080011537.8; 8 pages.
Chinese Certificate of Patent dated Apr. 2, 2014 for Chinese Application No. 201080011537.8; 4 pages.
Response to International Preliminary Report on Patentability dated Oct. 11, 2011 for European Application No. 10701269.2; 14 pages.
European Notice of Allowance dated Aug. 14, 2012 for European Application No. 10701269.2; 6 pages.
European Decision to Grant dated Nov. 15, 2012 for European Application No. 10701269.2; 2 pages.
English translation of Japanese Office Action dated May 13, 2013 for Japanese Application No. 2011-554057; 2 pages.
Instruction Letter for responding to Japanese Office Action dated May 13, 2013 for Japanese Application No. 2011-554057; 2 pages.
Response to Office Action with English claims dated Jul. 31, 2013 for Japanese Application No. 2011-554057; 5 pages.
Japanese Decision of Grant dated Oct. 30, 2013 for Japanese Application No. 2011-554057; 3 pages.
Korean Office Action with English translation dated Sep. 30, 2014 for Korean Application No. 10-2011-7023484; 6 pages.
Instruction Letter for responding to Korean Office Action dated Sep. 30, 2014 for Korean Application No. 10-2011-7023484; 2 pages.
Korean Response to Office Action filed Dec. 30, 2014 for Korean Application No. 10-2011-7023484; 14 pages.
Korean Notice of Allowance with English translation and allowed claims dated Apr. 20, 2015 for Korean Application No. 10-2011-7023484; 9 pages.
Korean Certificate of Patent dated Apr. 28, 2015 for Korean Application No. 10-2011-7023484; 24 pages.
Office Action dated Jan. 3, 2011 from U.S. Appl. No. 12/425,528; 14 pages.
Response to Office Action filed Apr. 1, 2011 for U.S. Appl. No. 12/425,528; 14 pages.
Final Office Action dated May 5, 2011 for U.S. Appl. No. 12/425,528; 14 pages.
Response to Final Office Action dated Jul. 5, 2011 for U.S. Appl. No. 12/425,529; 15 pages.
U.S. Notice of Allowance dated Sep. 14, 2011 and issue fee payment dated Sep. 23, 2011 for U.S. Appl. No. 12/425,529; 9 pages.
Office Action dated May 19, 2016 for U.S. Appl. No. 14/600,826; 13 pages.
Response to Office Action filed on Aug. 9, 2016 for U.S. Appl. No. 14/600,826; 10 pages.
Final Office Action dated Nov. 18, 2016 for U.S. Appl. No. 14/600,826; 15 pages.
Response to Final Office Action filed on Jan. 31, 2017 for U.S. Appl. No. 14/600,826; 12 pages.
Advisory Action dated Mar. 14, 2017 for U.S. Appl. No. 14/600,826; 6 pages.
Office Action dated May 19, 2017 for U.S. Appl. No. 14/600,826; 13 pages.
Response to Office Action filed on Aug. 14, 2017 for U.S. Appl. No. 14/600,826; 12 pages.
Final Office Action dated Nov. 30, 2017 for U.S. Appl. No. 14/600,826; 16 pages.
Response to Final Office Action filed on Jan. 9, 2018 for U.S. Appl. No. 14/600,826; 10 pages.
Advisory Action dated Feb. 23, 2018 for U.S. Appl. No. 14/600,826; 6 pages.
Notice of Allowance dated Mar. 26, 2018 for U.S. Appl. No. 14/600,826; 9 pages.

* cited by examiner

MAGNETIC FIELD SENSOR WITH AN ADJUSTABLE THRESHOLD FOR STRAY FIELD IMMUNITY

CROSS REFERENCE TO RELATED APPLICATIONS

Not Applicable.

STATEMENT REGARDING FEDERALLY SPONSORED RESEARCH

Not Applicable.

FIELD OF THE INVENTION

This disclosure relates generally to magnetic field sensors, and, more particularly, to magnetic field sensors and related techniques for adjusting a threshold signal in a magnetic field sensor to improve stray field immunity.

BACKGROUND

As is known, magnetic field sensors are used in a variety of applications. One example application is in motion (e.g., rotation) detectors where a magnetic field sensor is used to detect motion of an object, such as a ferromagnetic object, for example, a gear or ring magnet. In motion detectors, the magnetic field associated with the object is typically detected by a magnetic field sensing element, such as a Hall effect element or a magnetoresistance element, which provides a signal (i.e., a magnetic field signal) proportional to a detected magnetic field.

The magnetic field signal is compared to a threshold signal to generate an output signal that changes state when the magnetic field signal crosses the threshold signal. In one type of magnetic field sensor, sometimes referred to as a peak-to-peak percentage detector, one or more threshold levels are equal to respective percentages of the peak-to-peak magnetic field signal. Another type of magnetic field sensor, sometimes referred to as a slope-activated or peak-referenced detector, the threshold levels differ from the positive and negative peaks (i.e., the peaks and valleys) of the magnetic field signal by a predetermined amount. Thus, in this type of magnetic field sensor, the output signal changes state when the magnetic field signal comes away from a peak or valley of the magnetic field signal by the predetermined amount.

Some motion detectors generate an output signal indicative of the speed of motion of the object. Other motion detectors generate an output signal indicative of a direction of motion of the object as well. Magnetic field sensors are often used to detect gear features, such as gear teeth and/or gear slots. A magnetic field detector in this application is commonly referred to as a "gear tooth sensor." Gear tooth sensors are used in automotive applications to provide information to an engine control unit for ignition timing control, fuel management, and other operations.

In high precision applications such as automobiles, accuracy variations in the detected motion of a target object can be problematic. Engine ignition timing, for example, depends on consistent detection accuracy. Detection accuracy can be adversely affected by variations in the magnetic field signal that are attributable to factors other than the passing target. One source of such magnetic field variations is stray magnetic fields. Such stray fields can affect the magnetic field signal to an extent that the sensor output signal either switches when it should not or does not switch when it should, thereby adversely affecting the accuracy of the sensor output signal.

SUMMARY

Described herein are magnetic field sensors that detect motion of a target with immunity to external magnetic perturbations, such as stray magnetic fields, by generating a threshold signal that varies with the speed of motion of the target. In this way, the threshold signal level is tailored based on expected external magnetic perturbations associated with different target speeds.

According to the disclosure, a magnetic field sensor for detecting motion of an object includes one or more magnetic field sensing elements configured to generate a magnetic field signal in response to a magnetic field associated with the object and a detector responsive to the magnetic field signal and to a threshold signal and configured to generate a comparison signal having edges occurring in response to a comparison of the magnetic field signal and the threshold signal and occurring at a rate corresponding to a speed of motion of the object. A speed monitor is responsive to the comparison signal to generate a speed signal having a value corresponding to a duration between edges of the comparison signal and indicative of the speed of motion of the object. A threshold generator having an input coupled to receive the speed signal from the speed monitor and an output coupled to the detector is configured to generate the threshold signal at a first level when the value of the speed signal indicates that the speed of motion of the object is greater than a predetermined speed and at a second level when the value of the speed signal indicates that the speed of motion of the object is less than the predetermined speed.

Features may include one or more of the following individually or in combination with other features. The predetermined speed may be selected based on an external magnetic perturbation expectation. A peak-to-peak detector can be coupled to receive the magnetic field signal and configured to detect a peak-to-peak level of the magnetic field signal and generate a detected peak-to-peak value indicative of the peak-to-peak level of the magnetic field signal. The first level of the threshold signal can be a predetermined percentage of the detected peak-to-peak value, such as approximately 70%. In embodiments, the first level of the threshold signal can include a hysteresis amount. The second level of the threshold signal can be a fixed value, such as approximately 50% of a nominal peak-to-peak level of the magnetic field signal. The fixed value can correspond to a TPO threshold. Alternatively, the second level of the threshold signal can be a predetermined percentage of the detected peak-to-peak value, such as approximately 50%. The detector can include a running mode detector and the magnetic field sensor can further include a TPOS detector responsive to the magnetic field signal and to a fixed threshold signal and configured to generate a TPOS detector output signal having edges occurring in response to a comparison of the magnetic field signal and the fixed threshold signal and occurring at a rate corresponding to a speed of motion of the object, wherein the TPOS detector operates during a first time interval following sensor power on and wherein the running mode detector operates during a second time interval following the first time interval.

Also described is a method for adjusting a threshold signal of a magnetic field sensor including generating a magnetic field signal with one or more magnetic field sensing elements, the magnetic field signal indicative of motion of an object proximate to the magnetic field sensor, generating a threshold signal at a first level, comparing the threshold signal to the magnetic field signal to generate a comparison signal having transitions occurring when the magnetic field signal crosses the threshold signal, generating a speed signal based on the comparison signal, wherein the speed signal has a value indicative of a speed of motion of the object, and changing the threshold signal from the first level to a second level when the value of the speed signal indicates that the speed of motion of the object is below a predetermined speed.

Features may include one or more of the following individually or in combination with other features. The predetermined speed may be selected based on an external magnetic perturbation expectation. The method may include detecting a peak-to-peak level of the magnetic field signal and generating a detected peak-to-peak value indicative of the peak-to-peak level of the magnetic field signal. Generating the threshold signal at the first level may include generating the threshold signal at a predetermined percentage of the detected peak-to-peak level, such as approximately 70%. The first level of the threshold signal may include a hysteresis amount. The second level of the threshold signal can be a fixed value, such as approximately 50% of a nominal peak-to-peak level of the magnetic field signal. The fixed value can correspond to a TPO threshold. Alternatively, the second level of the threshold signal can be a predetermined percentage of the detected peak-to-peak value, such as approximately 50%.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
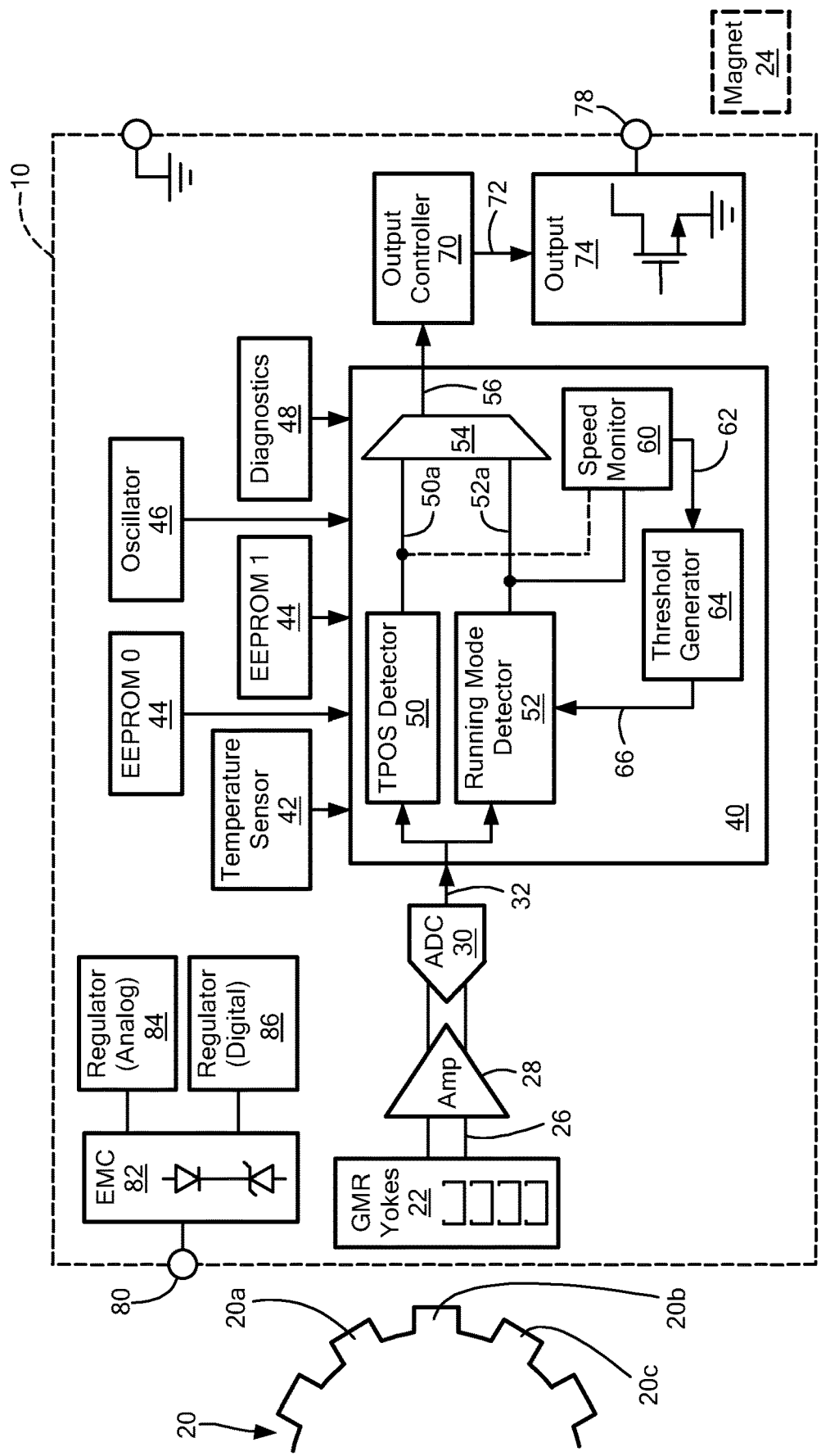
FIG. 1 is a block diagram of a magnetic field sensor according to the disclosure.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Referring to FIG. 1, a magnetic field sensor 10 capable of detecting motion (e.g., speed of motion and/or direction of motion) of an object 20 includes one or more magnetic field sensing elements 22 configured to generate a magnetic field signal 32 in response to a magnetic field associated with the object and a detector 52 responsive to the magnetic field signal 32 and to a threshold signal 66 and configured to generate a comparison signal 52a having edges occurring in response to a comparison of the magnetic field signal and the threshold signal and occurring at a rate corresponding to a speed of motion of the object.

It will be appreciated that edges of the comparison signal 52a (referred to alternatively herein as the detector output signal) coincide with locations on the target object 20. The edge locations may, for example, correspond to mechanical or magnetic target features such as tooth edges, tooth centers, notch centers, pole boundaries, or pole maxima. In order to accurately detect target speed, it is important that the detector output signal 52a switch in the presence of a feature and not switch in the absence of a feature. In some applications under certain conditions, stray external magnetic perturbations (e.g., magnetic fields that are not attributable to target movement and features) can interfere with switching accuracy (i.e., can cause error between electrical commutations and features of the target). For example, in CAM sensing applications, significant magnetic perturbations can occur at start-up or after stop-go events due to high currents in cables near the sensor that drive an alternator or electrical motor or coils, for example.

According to the disclosure, a speed monitor 60 is responsive to the comparison signal 52a to generate a speed signal 62 having a value indicative of the speed of motion of the object and a threshold generator 64 having an input coupled to receive the speed signal 62 from the speed monitor 60 and an output coupled to the detector 52 is configured to generate the threshold signal 66 at a first level when the speed signal indicates that the speed of the object is greater than a predetermined speed and at a second level when the speed signal indicates that the speed of the object is less than the predetermined speed. With this arrangement, the threshold signal level is tailored to provide immunity to external magnetic perturbations, such as stray magnetic fields, based on expected external magnetic perturbations associated with different target speeds. In particular, the threshold signal 66 is adjusted in order to minimize such inaccuracies by adjusting the threshold signal level at slower target speeds when such interfering magnetic fields generally occur. As will become apparent, providing the threshold signal 66 at a lower (e.g., mid-range) level when the target speed is slower and at a higher level when the target speed is faster provides improved accuracy in the detector output signal 52a by eliminating missed switching (i.e., a failure of the signal to transition when it should).

The magnetic field sensor 10 includes one or more magnetic field sensing elements, as indicated by magnetic field sensing element 22 in the example shown. The magnetic field sensing element 22 is configured to generate a magnetic field signal 26 in response to a magnetic field associated with the object 20. Object 20 may have features, e.g., gear teeth 20a, 20b, 20c of a ferromagnetic gear, as shown. The object 20 can be disposed, for example, upon a rotatable shaft. The object 20 may be coupled to an automobile wheel, steering shaft, or a camshaft, as a few examples.

Sensor 10 can include a permanent magnet 24 disposed within or proximate to the sensor package in a so-called "back-biased" arrangement. In a back-biased arrangement, object, or target 20 is ferromagnetic and sensor 10 experiences changes of magnetic field generated by the permanent magnet 24 as the target 20 moves (e.g., rotates). It will be appreciated that, alternatively, target 20 can be a magnet that generates a magnetic field that varies as the target moves for detection by sensor 10, in which case the back-bias magnet 24 can be omitted. By way of one non-limiting example, target 20 can take the form of a so-called ring magnet having magnetic domains that are detected by the magnetic field sensor 10. Motion of the object 20 results in variations of the magnetic field sensed by the magnetic field sensing element 22 and, thus, result in variations of the magnetic field signal 26 generated by the magnetic field sensing element.

Although the magnetic field sensing element 22 is depicted as a plurality of giant magnetoresistance (GMR) elements or yokes, in some embodiments the magnetic field sensing element is, for example, provided as one or more of a Hall effect element, a magnetoresistance element in the form of an anisotropic magnetoresistance (AMR) element, a tunneling magnetoresistance (TMR) element, a magnetic tunnel junction (MTJ) element, or a spin valve element. It should be appreciated that the magnetic field sensing element 22 (which may comprise one or more magnetic field sensing elements) may take any form suitable for detecting motion of the object 20 by sensing a magnetic field affected by such motion.

The magnetic field sensor 10 includes a signal path (e.g., an analog, digital or mixed signal path) coupled to receive the magnetic field signal 26 and configured to generate a signal (e.g., digital signal 32) representative of the magnetic field signal 26. The signal path includes an amplifier 28 and an analog-to-digital converter (ADC) 30 in the example embodiment shown. The signal path may further include one or more filters.

The magnetic field sensor 10 further includes a controller, or processor 40 that is coupled to receive the digital signal 32 and signals from a temperature sensor 42, one or more memory devices (e.g., EEPROMs) 44, an oscillator 46, and a diagnostic circuit 48. Controller is configured to generate a detector output signal 56 indicative of one or both of a speed of motion of the object 20 or a direction of motion of the object 20. To this end, controller 40 can include a TPOS detector 50 and a running mode detector 52. Both detectors 50, 52 are configured to compare the digital magnetic field signal 32 to a respective threshold signal and generate a respective detector output signal 50a, 52a having edges occurring in response to the comparison. The detector output signals 50a, 52a are generally square-wave signals having transitions occurring at a rate indicative of the speed of motion (e.g., rotation) of the object 20.

TPOS detector 50 generally provides the detector output signal 56 during a power on mode of operation and running mode detector 52 is generally used to provide the detector output signal 56 after the power on mode to provide a more accurate detector output signal than the TPOS detector 50. A multiplexer 54 illustrates selection of the TPOS detector output signal 50a or the running mode detector output signal 52a to provide the detector output signal 56 based on the operational stage of the sensor. For example, the multiplexer 54 can select the TPOS output signal 50a to provide the detector output signal 56 at power on and can select the running mode output signal 52a to provide the detector output signal 56 after a predetermined number of edges of the TPOS output signal 50a have been detected. It will be appreciated by those of ordinary skill in the art that other schemes are possible for selecting which output signal 50a, 52a provides the detector output signal 56.

TPOS detector 50 may compare the digital magnetic field signal 32 to a fixed threshold signal, as may be referred to as a TPOS or TPO threshold. Since the peak-to-peak level of the magnetic field signal is a function of air gap (i.e., the distance between the sensing element 22 and the target 20), generally, the TPOS threshold is set relatively low in order to ensure output signal switching for a range of air gaps.

Running mode detector 52 is coupled to a receive threshold signal 66 from threshold generator 64 and is configured to compare the magnetic field signal 32 to the threshold signal 66 in order to generate detector output signal 52a. The detector 52 may take various forms, for example, a peak-to-peak percentage detector in which the threshold signal is a percentage of the peak-to-peak value of the magnetic field signal. Alternatively, the detector 52 can be a so-called slope-activated or peak-referenced detector in which the threshold signal differs from the positive and/or negative peaks (i.e., the peaks and valleys) of the magnetic field signal 32 by a predetermined amount.

The example running mode detector 52 is a peak-to-peak percentage detector. To this end, the sensor includes a peak-to-peak detector to detect a peak-to-peak level of the magnetic field signal 32 and generate a detected peak-to-peak value indicative of the peak-to-peak level of the magnetic field signal. It will be appreciated that the peak-to-peak detector can be incorporated into the controller 40 as part of, or separate from the running mode detector 52 or the threshold generator 64 as non-limiting examples. In embodiments in which the running mode detector 52 is a peak-referenced detector, the sensor can include a peak detector (e.g., as may include one or more digital to analog converters or DACs, such as a positive DAC or PDAC to track positive peaks and a negative DAC or NDAC to track negative peaks of the magnetic field signal).

Running mode detector 52 may operate with hysteresis, such that once the magnetic field signal 32 crosses a first hysteresis level of the threshold signal 66 in a first direction (e.g., rising direction, or positive slope), the magnetic field signal 32 must fall to a second hysteresis level of the threshold signal in order to cause a transition of the detector output signal 52a. As one non-limiting example, in an embodiment in which the threshold signal 66 used by the running mode detector 52 may has a nominal level at 70% of the peak-to-peak level of the magnetic field signal 32, transitions of the detector output signal 52a may occur at +/−10% of the 70% level. In other words, the detector output signal 52a may transition to a first signal level when the magnetic field signal rises to cross 77% of the peak-to-peak level of the magnetic field signal 32 and may transition to a second signal level when the magnetic field signal falls to below 63% of the peak-to-peak level of the magnetic field signal 32.

According to the disclosure, speed monitor 60 determines the speed of motion of the object 20 for use by the threshold generator 64. In embodiments, the speed monitor 60 is coupled to receive the running mode detector output signal 52a and is configured to generate a speed signal 62 having a value corresponding to a duration between like edges of the detector output signal 52a (i.e., between consecutive rising edges or between consecutive falling edges). For example, the speed monitor 60 can include a counter to generate a count signal having a value corresponding to a duration between like edges of the detector output signal 52a. It will be appreciated that in some embodiments, the speed monitor 60 can be coupled to receive the TPOS detector output signal 50a (as illustrated by the dotted line connection) and can generate the speed signal 62 based on the TPOS detector output signal 50a. In such embodiments, the speed signal 62 can have a value corresponding to a duration between like edges of the detector output signal 50a. A filter can be responsive to the count signal and configured to generate the speed signal 62, for example, as an average of a predetermined number of count signal values.

The threshold generator 64 is coupled to receive the speed signal 62 from the speed monitor 60 and is configured to generate the threshold signal 66 at the first level when the value of the speed signal 62 indicates that the speed of motion of the object is greater than a predetermined speed (e.g., greater than 500 RPM) and at a second level when the value of the speed signal indicates that the speed of motion of the object is less than the predetermined value.

The first level of the threshold signal 66 generated at higher target speeds can be at a predetermined percentage of the peak-to-peak level of the magnetic field signal 32, such as 70%. Various factors can be considered in order to select the predetermined percentage, such as target and/or magnetic field sensing element and/or installation (e.g., air gap) characteristics.

The second level of the threshold signal 66 generated at lower target speeds can be a lower level than the first threshold level for applications in which external magnetic perturbations are expected to cause the magnetic field signal to be lower than it would be otherwise. In general, the second threshold level is selected in order to ensure detector output signal switching even in the presence of expected external magnetic perturbations such as stray fields. In some embodiments, the second threshold level can be a mid-range level and can be a fixed level (e.g., a fixed level that corresponds to 50% or some other generally mid-range point of the nominal peak-to-peak level of the magnetic field signal 32). In such embodiments, it will be appreciated that the second threshold level can be the fixed threshold level used by the TPOS detector 50. Such a fixed threshold level can be implemented within the running mode detector 52 or can be implemented by having the TPOS detector 50 resume generation of the detector output signal 56. Alternatively, the second threshold level can be a percentage of the detected peak-to-peak level of the magnetic field signal 32, such as 50% or some other percentage that is nearer to 50% than to 70% for example.

In some embodiments, the first and second levels of the threshold signal 66 can be programmable and/or user selectable. EEPROMs 44 can store threshold signal level options and/or other programmable sensor parameters.

The detector output signal 56 can be coupled to an output controller 70 configured to provide an output signal 72 to a driver 74 in order to generate an output signal of the sensor at output 78. Output controller 70 can generate signal 72 in various formats including, but not limited to PWM format, Single Edge Nibble Transmission (SENT) format, a Serial Peripheral Interface (SPI) format, a Local Interconnect Network (LIN) format, a CAN (Controller Area Network) format, an Inter-Integrated Circuit ($I^2C$) format.

The sensor 10 can be provided in the form of an integrated circuit (IC) and can receive power at an input 80 that has an electromagnetic protection device 82 and is coupled to one or more on-chip regulators, such as the illustrated regulator 84 that generates a regulated voltage for powering analog circuitry of the sensor and regulator 86 that generates a regulated voltage for powering digital circuitry of the sensor.

Controller 40 can further implement various signal conditioning and compensation, as may be performed on the magnetic field signal 32 prior to comparison by detector 52. For example, temperature compensation can be implemented based on information from temperature sensor 42. Offset and gain adjustment can be performed based on programmable parameters such as gain correction coefficients and offset correction coefficients as may be stored in EEPROM 44. Diagnostic circuit 48 can implement various on-chip diagnostics and can provide one or more signals or flags to the controller 40 for communication of a fault condition to external circuits or systems as part of the sensor output signal.

While the magnetic field sensor 10 may be provided in the illustrated form of an IC with an analog front end portion and a digital portion, it will be appreciated that the particular delineation of which circuit functions are implemented in an analog fashion or with digital circuitry and signals can be varied. Further, some of the illustrated circuit functions can be implemented on an integrated circuit sensor 10 and other circuitry and functionality can be implemented on separate circuits (e.g., additional substrates within the same integrated circuit package, or additional integrated circuit packages, and/or on circuit boards).

Figure 2:
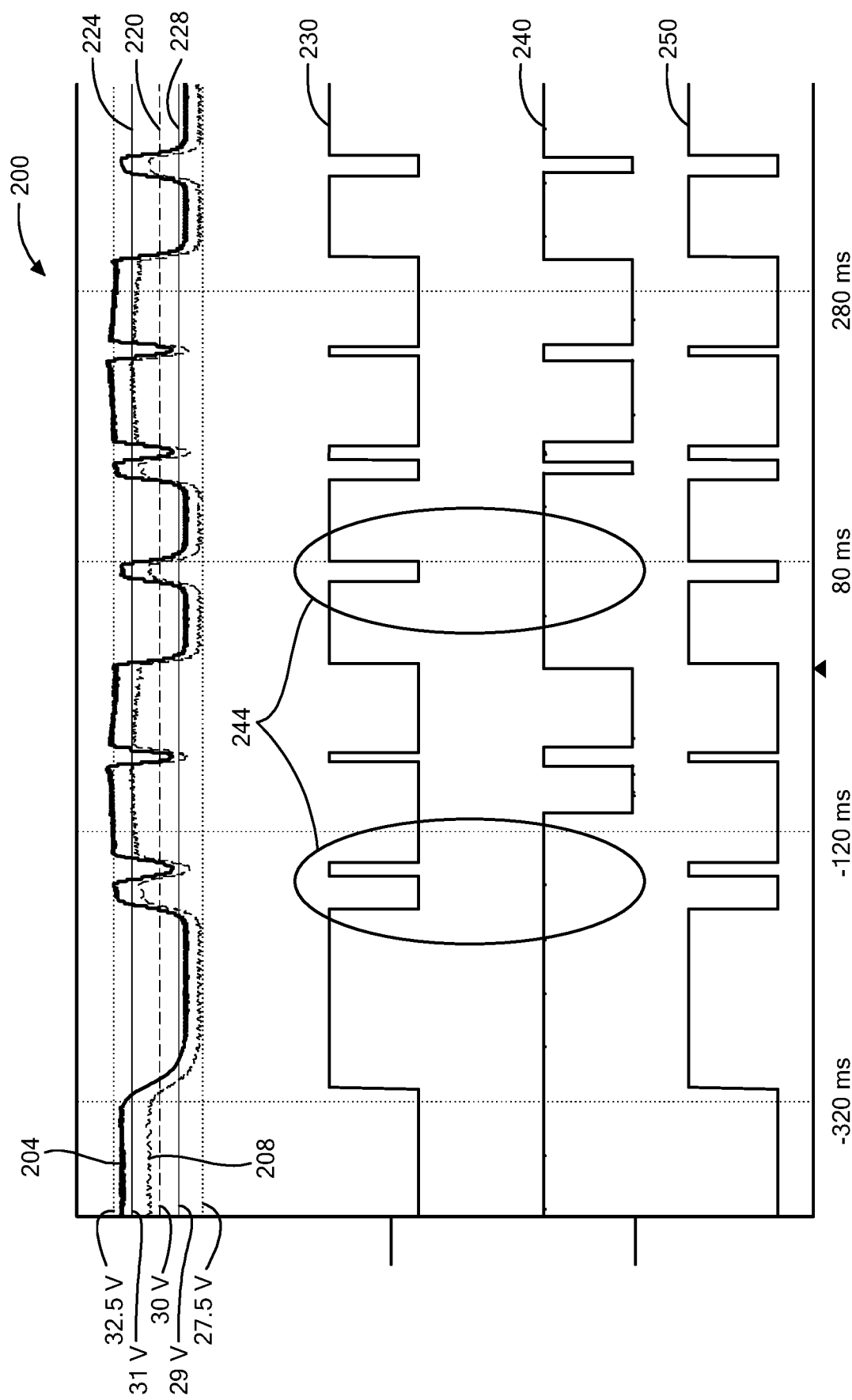
FIG. 2 shows example waveforms associated with the magnetic field sensor of FIG. 1.

Referring also to FIG. 2, waveform plots having a horizontal axis with a scale in time units and a vertical axis with a scale in voltage units are shown to illustrate threshold signal adjustment based on detected target speed and the resulting improved switching accuracy of the detector output signal 52a. Signal 204 can be the same as or similar to magnetic field signal 26 (FIG. 1) and signal 208 represents the magnetic field signal 26 during a time when an external magnetic perturbation occurs and is sensed by the sensing element 22. For example, signal 208 can occur when stray magnetic fields within the application environment are experienced by the sensing element 22 (e.g., in some automotive applications high currents at start-up and during stop and go operation).

Threshold signal 224 corresponds to a first level used to generate the detector output signal 52a when the target speed is greater than a predetermined speed. Here, the first level 224 is selected to be approximately 70% of the detected peak-to-peak level of the magnetic field signal. Threshold signal 220 corresponds to a second level used to generate the detector output signal 52a when the target speed is less than the predetermined speed. Here, the second level 22 is selected to be approximately 50% of the detected peak-to-peak level of the magnetic field signal.

Signal 230 represents the detector output signal 52a when magnetic field signal 204 is compared to the first threshold level 224, with signal transitions corresponding to the magnetic field signal 204 crossing threshold 224. Signal 240 on the other hand represents the detector output signal 52a when magnetic field signal 208 that is affected by stray fields for example is compared to the first threshold level 224, with signal transitions corresponding to the magnetic field signal 208 crossing threshold 224. As is apparent, several transitions that appear in signal 230 do not occur in signal 240 (i.e., in so-called "missing teeth" areas labeled 244), thereby resulting in reduced accuracy if signal 240 were used to generate the sensor output signal.

According to the disclosure, when the target speed is below the predetermined speed, the threshold signal is adjusted to the second level 220. Signal 250 corresponds to comparison of the magnetic field signal 208 to the second threshold level 220. As is apparent, signal 250 contains the same transitions as signal 224 (i.e., the missing transitions are eliminated). Thus, it can be seen that by changing the threshold signal level when the target speed is below the predetermined level that corresponds to the level below which stray fields are expected to occur, the accuracy of the detector output signal 52a can be improved.

Figure 3:
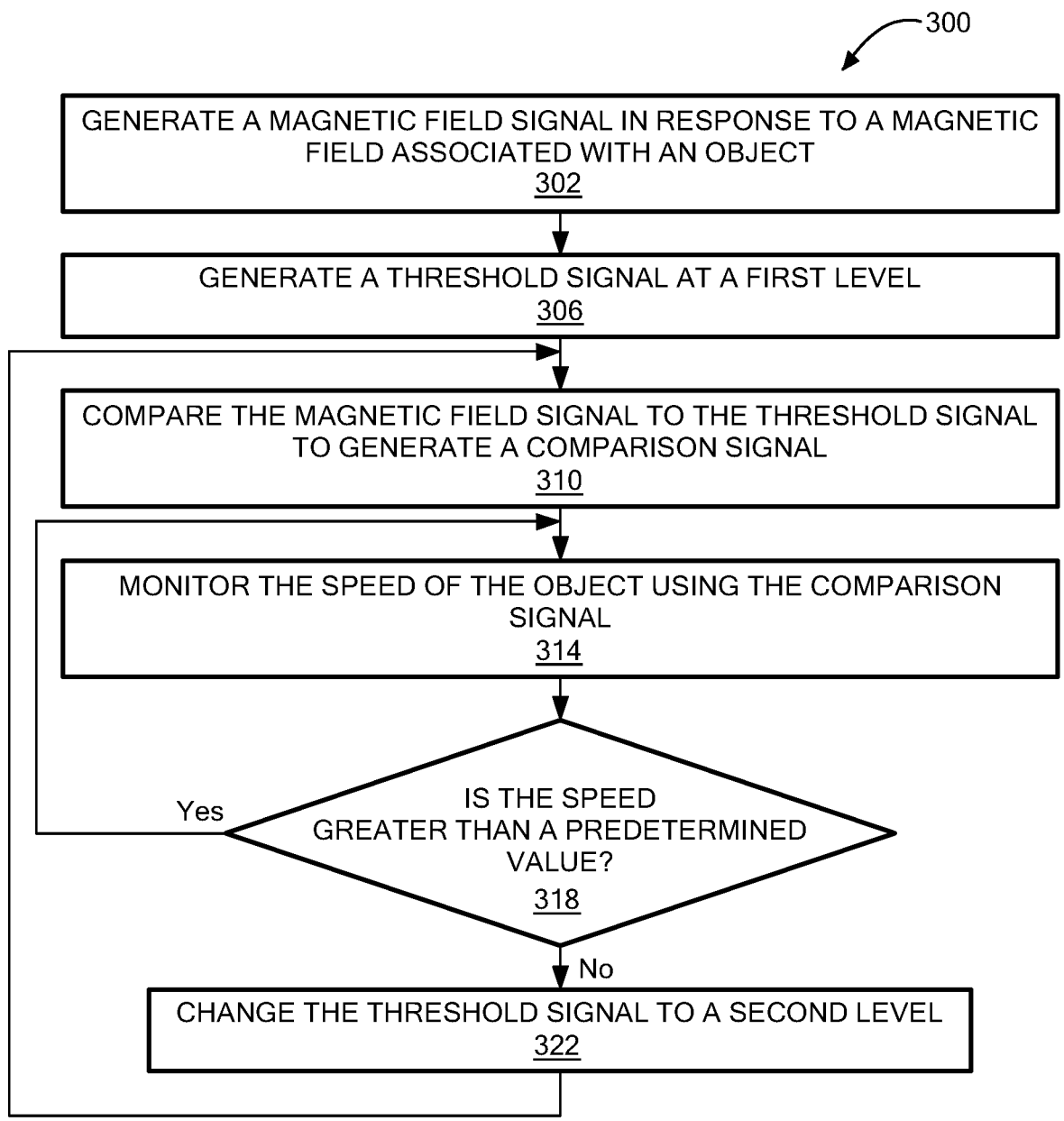
FIG. 3 is a flow diagram illustrating threshold adjustment in the magnetic field sensor of FIG. 1.

Referring also to FIG. 3, a flow diagram illustrates a process 300 for generating a detector output signal indicative of motion of a target during a running mode of sensor operation. The process commences at block 302 by generating a magnetic field signal in response to a magnetic field associated with the object. At block 306, a threshold signal is generated at a first signal level. In the example embodiment, the first threshold level is a predetermined percentage of a detected peak-to-peak level of the magnetic field signal, such as 70%.

At block 310, the magnetic field signal is compared to the threshold in order to generate a comparison signal. The speed of motion (e.g., rotation) of the object is monitored at block 314 and, at block 318, it is determined whether the speed is greater than a predetermined value. If the speed is greater than the predetermined value, then block 314 is repeated. In this way, as long as the speed stays above the predetermined value, blocks 314 and 318 are periodically repeated. If however it is determined at block 318 that the speed of motion is less than the predetermined value, then the threshold signal level is adjusted to be at a second, different level at block 322, following which block 310 is repeated, as shown. As noted above, the second level of the threshold signal that is generated for use at lower target speeds can be a fixed value (e.g., at 50% of a nominal peak-to-peak magnetic field signal level) or can be a predetermined percentage of the detected peak-to-peak magnetic field signal level (e.g., 50% of the detected peak-to-peak magnetic field signal level). As noted above, in embodiments in which the second threshold signal level is a fixed level as may correspond to a TPOS detector threshold level, the TPOS threshold can be used as the second threshold level at block 322 or the sensor can resume TPOS operation (TPOS detector 50 can be used to generate the detector output signal 56).

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A magnetic field sensor for detecting motion of an object, comprising:
    one or more magnetic field sensing elements configured to generate a magnetic field signal in response to a magnetic field associated with the object;
    a detector responsive to the magnetic field signal and to a threshold signal and configured to generate a comparison signal having edges occurring in response to a comparison of the magnetic field signal and the threshold signal and occurring at a rate corresponding to a speed of motion of the object;

a speed monitor responsive to the comparison signal to generate a speed signal having a value corresponding to a duration between edges of the comparison signal and indicative of the speed of motion of the object; and a threshold generator having an input coupled to receive the speed signal from the speed monitor and an output coupled to the detector, wherein the threshold generator is configured to generate the threshold signal at a first level when the value of the speed signal indicates that the speed of motion of the object is greater than a predetermined speed and at a second level when the value of the speed signal indicates that the speed of motion of the object is less than the predetermined speed, wherein the predetermined speed is selected based on external magnetic perturbation expectations at different object speeds.

2. The magnetic field sensor of claim 1, further comprising a peak-to-peak detector coupled to receive the magnetic field signal and configured to detect a peak-to-peak level of the magnetic field signal and generate a detected peak-to-peak value indicative of the peak-to-peak level of the magnetic field signal.

3. The magnetic field sensor of claim 2, wherein the first level of the threshold signal is a predetermined percentage of the detected peak-to-peak value.

4. The magnetic field sensor of claim 3, wherein the predetermined percentage of the detected peak-to-peak value is 70%+/−10%.

5. The magnetic field sensor of claim 4, wherein the first level of the threshold signal comprises a hysteresis amount.

6. The magnetic field sensor of claim 1, wherein the second level of the threshold signal is a fixed value.

7. The magnetic field sensor of claim 6, wherein the fixed value corresponds to 50% of a nominal peak-to-peak level of the magnetic field signal.

8. The magnetic field sensor of claim 2, wherein the second level of the threshold signal is a predetermined percentage of the detected peak-to-peak value.

9. The magnetic field sensor of claim 8, wherein the predetermined percentage of the detected peak-to-peak value is 50%.

10. The magnetic field sensor of claim 1, wherein the detector comprises a first, running mode detector and wherein the magnetic field sensor further comprises a second detector responsive to the magnetic field signal and to a fixed threshold signal and configured to generate a second detector output signal having edges occurring in response to a comparison of the magnetic field signal and the fixed threshold signal and occurring at a rate corresponding to a speed of motion of the object, wherein the second detector operates during a first time interval following sensor power on and wherein the running mode detector operates during a second time interval following the first time interval.

11. A method for adjusting a threshold signal of a magnetic field sensor comprising:

generating a magnetic field signal with one or more magnetic field sensing elements, the magnetic field signal indicative of motion of an object proximate to the magnetic field sensor;

generating a threshold signal at a first level;

comparing the threshold signal to the magnetic field signal to generate a comparison signal having transitions occurring when the magnetic field signal crosses the threshold signal;

generating a speed signal based on the comparison signal, wherein the speed signal has a value indicative of a speed of motion of the object; and changing the threshold signal from the first level to a second level when the value of the speed signal indicates that the speed of motion of the object is below a predetermined speed, wherein the predetermined speed is selected based on external magnetic perturbation expectations at different object speeds.

12. The method of claim 11, further comprising detecting a peak-to-peak level of the magnetic field signal and generating a detected peak-to-peak value indicative of the peak-to-peak level of the magnetic field signal.

13. The method of claim 12, wherein generating the threshold signal at the first level comprises generating the threshold signal at a predetermined percentage of the detected peak-to-peak level.

14. The method of claim 13, wherein the predetermined percentage of the detected peak-to-peak value is 70%+/−10%.

15. The method of claim 13, wherein the first level of the threshold signal comprises a hysteresis amount.

16. The method of claim 11, wherein the second level of the threshold signal is a fixed value.

17. The magnetic field sensor of claim 16, wherein the fixed value corresponds to 50% of a nominal peak-to-peak level of the magnetic field signal.

18. The magnetic field sensor of claim 12, wherein the second level of the threshold signal is a predetermined percentage of the detected peak-to-peak value.

19. The magnetic field sensor of claim 18, wherein the predetermined percentage of the detected peak-to-peak value is 50%.

20. A magnetic field sensor for detecting motion of an object, comprising:

one or more magnetic field sensing elements configured to generate a magnetic field signal in response to a magnetic field associated with the object;

a detector responsive to the magnetic field signal and to a threshold signal and configured to generate a comparison signal having edges occurring in response to a comparison of the magnetic field signal and the threshold signal and occurring at a rate corresponding to a speed of motion of the object;

a speed monitor responsive to the comparison signal to generate a speed signal having a value corresponding to a duration between edges of the comparison signal and indicative of the speed of motion of the object;

a threshold generator having an input coupled to receive the speed signal from the speed monitor and an output coupled to the detector, wherein the threshold generator is configured to generate the threshold signal at a first level when the value of the speed signal indicates that the speed of motion of the object is greater than a predetermined speed and at a second level when the value of the speed signal indicates that the speed of motion of the object is less than the predetermined speed; and a peak-to-peak detector coupled to receive the magnetic field signal and configured to detect a peak-to-peak level of the magnetic field signal and generate a detected peak-to-peak value indicative of the peak-to-peak level of the magnetic field signal, wherein the first level of the threshold signal is a first predetermined percentage of the detected peak-to-peak value and wherein the second level of the threshold signal is one of (i) a fixed value; or (ii) a second predetermined percentage of the detected peak-to-peak value lower than the first percentage.

21. The magnetic field sensor of claim 20 wherein the detector comprises a first, running mode detector and wherein the sensor further comprises a second detector responsive to the magnetic field signal and to a fixed threshold signal and configured to generate a second detector output signal having edges occurring in response to a comparison of the magnetic field signal and the fixed threshold signal and occurring at a rate corresponding to a speed of motion of the object, wherein the second detector operates during a first time interval following sensor power on and wherein the running mode detector operates during a second time interval following the first time interval.

22. The magnetic field sensor of claim 21 wherein the second level of the threshold signal comprises the fixed threshold signal to which the second detector responds.

\* \* \* \* \*